(12) United States Patent  
Suzuki et al.

(10) Patent No.: US 9,083,423 B2  
(45) Date of Patent: Jul. 14, 2015

(54) SEMICONDUCTOR CIRCUIT, D/A CONVERTER, MIXER CIRCUIT, RADIO COMMUNICATION DEVICE, METHOD FOR ADJUSTING THRESHOLD VOLTAGE, AND METHOD FOR DETERMINING QUALITY OF TRANSISTOR

(71) Applicant: KABUSHIKI KAISHA TOSHIBA, Minato-ku, Tokyo (JP)

(72) Inventors: Masamichi Suzuki, Tokyo (JP); Hirotaka Nishino, Yokohama (JP); Kazuya Matsuzawa, Kamakura (JP); Izumi Hirano, Kuwana (JP); Takao Marukame, Tokyo (JP); Yusuke Higashi, Kawasaki (JP); Takahiro Kurita, Sagamihara (JP); Yuki Sasaki, Yokohama (JP); Yuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 14/108,651

(22) Filed: Dec. 17, 2013

(65) Prior Publication Data

US 2014/0227989 A1    Aug. 14, 2014

(30) Foreign Application Priority Data

Feb. 13, 2013    (JP) .................................. 2013-025960

(51) Int. Cl.
| | |
|---|---|
| *H04B 1/26* | (2006.01) |
| *H04B 1/16* | (2006.01) |
| *H03D 7/14* | (2006.01) |
| *H03M 1/10* | (2006.01) |
| *H01L 29/792* | (2006.01) |
| *H03M 1/74* | (2006.01) |

(52) U.S. Cl.
CPC ................ *H04B 1/16* (2013.01); *H01L 29/792* (2013.01); *H03D 7/1441* (2013.01); *H03D 7/1458* (2013.01); *H03M 1/108* (2013.01); *H03M 1/745* (2013.01)

(58) Field of Classification Search
CPC ........................................................ H04B 1/16
USPC ....................... 455/326, 73, 91; 341/144, 136
See application file for complete search history.

(56) References Cited

U.S. PATENT DOCUMENTS 7,596,932 B2 * 10/2009 Sink et al. ........................ 53/485
7,911,864 B2 *  3/2011 Itoh .............................. 365/211

(Continued)

FOREIGN PATENT DOCUMENTS

JP        2002-335182         11/2002

OTHER PUBLICATIONS

Carley, L.R., "Trimming analog Circuits Using Floats-Gate Analog MOS Memory" IEEE Journal of Solid-State Circuits, vol. 24, No. 6, pp. 1569-1575, (Dec. 1989).

(Continued)

*Primary Examiner* — Sanh Phu

(74) *Attorney, Agent, or Firm* — Finnegan, Henderson, Farabow, Garrett & Dunner, L.L.P.

(57) ABSTRACT

According to an embodiment, a semiconductor circuit includes a substrate, a tunnel oxide film, a charge storage film, a blocking layer, and plural nodes. The substrate is made of a semiconductor in which two diffusion layers each serving as either a source or a drain are formed. The tunnel oxide film is formed on a region of the substrate between the diffusion layers. The charge storage film is formed on the tunnel oxide layer and stores charge. The blocking layer is formed between the charge storage film and a gate electrode and has layers of a first oxide film, a nitride film and a second oxide film to have a thickness of 5 nm or larger but 15 nm or smaller. The nodes allow external application of voltages so that the source and the drain are reversed and allow detection a gate voltage, a drain current and a substrate current.

7 Claims, 11 Drawing Sheets

(56) References Cited

U.S. PATENT DOCUMENTS

| | | |
|---|---|---|
| 8,849,219 B2 * | 9/2014 | Deguchi et al. ................ 455/73 |
| 2013/0252559 A1 | 9/2013 | Deguchi et al. |

OTHER PUBLICATIONS

Arreghini, A. et al., "Long Term Charge Retention Dynamics of SONOS Cells," Solid-State Electronics, vol. 52, pp. 1460-1466, (2008).

* cited by examiner

SEMICONDUCTOR CIRCUIT, D/A CONVERTER, MIXER CIRCUIT, RADIO COMMUNICATION DEVICE, METHOD FOR ADJUSTING THRESHOLD VOLTAGE, AND METHOD FOR DETERMINING QUALITY OF TRANSISTOR

CROSS-REFERENCE TO RELATED APPLICATIONS

This application is based upon and claims the benefit of priority from Japanese Patent Application No. 2013-025960, filed on Feb. 13, 2013; the entire contents of which are incorporated herein by reference.

FIELD

Embodiments described herein relate generally to a semiconductor circuit, a D/A converter, a mixer circuit, a radio communication device, a method for adjusting a threshold voltage, and a method for determining the quality of a transistor.

BACKGROUND

In radio communication devices, for example, it is necessary to reduce second-order distortion in received signals. When a single balanced mixer having a pair of MOS transistors is used, even the transistors placed adjacent to each other on a chip have significantly different threshold voltages, which may cause second-order distortion. In order to overcome the disadvantage of variation in the threshold voltages of the transistors, there is a measure of providing an additional circuit. For example, there is a method of providing means for calibrating the DC bias in an input unit of a direct-conversion mixer, for calibrating the DC bias of thresholds set for a reception level and a transmission power to reduce the influence of the second-order distortion. With such a technique requiring the additional circuit, however, the circuitry for the adjustment will be very complicated and large, which will undermine the advantage that direct conversion mixers are small in size.

A few group reports a measure to suppress variation in the threshold voltages using memory transistors. There have been however, no discussions on data retention characteristics that are one of the most important characteristics of memory transistors in the reports on threshold variation compensating circuits using memory transistors proposed so far. Circuits in which threshold variation is compensated are desired to have sufficient data retention characteristics.

DETAILED DESCRIPTION

According to an embodiment, a semiconductor circuit includes a substrate, a tunnel oxide film, a charge storage film, a blocking layer, and a plurality of nodes. The substrate is made of a semiconductor in which two diffusion layers each serving as either a source or a drain are formed. The tunnel oxide film is formed on a region of the substrate between the diffusion layers. The charge storage film is formed or the tunnel oxide layer and stores charge. The blocking layer is formed between the charge storage film and a gate electrode and has layers of a first oxide film, a nitride film and a second oxide film to have a thickness of 5 nm or larger but 15 nm or smaller. The nodes allow external application of voltages so that the source and the drain are reversed and allow detection a gate voltage, a drain current and a substrate current.

Embodiment

Figure 1:
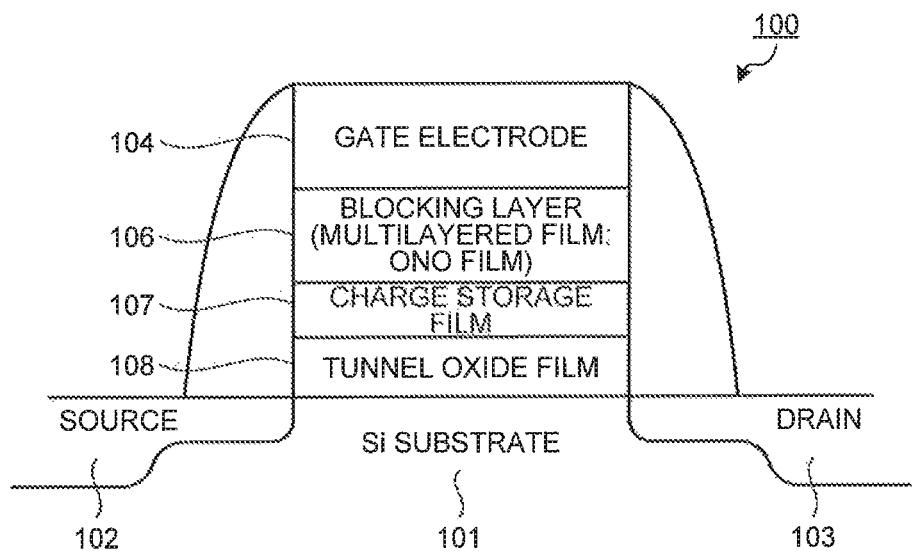
FIG. 1 is a cross sectional view illustrating an outline of a structure of a semiconductor circuit according to an embodiment.

A semiconductor circuit according to an embodiment will be described below with reference to the accompanying drawings. FIG. 1 is a cross sectional view illustrating an outline of a structure of a semiconductor circuit 100 according to the embodiment.

The semiconductor circuit 100 is a charge storage type memory transistor, for example. As illustrated in FIG. 1, the semiconductor circuit 100 has diffusion layers that serve as a source 102 and a drain 103 formed in a Si (p-well) substrate

101. The semiconductor circuit 100 also has a blocking layer 106, a charge storage film 107 and a tunnel oxide film 108, for example, between a region of the substrate 101 between the diffusion layers and a gate electrode 104.

The tunnel oxide film 108 is a silicon dioxide film ($SiO_2$ film), for example, formed on the region of die substrate 101 between the diffusion layers. The charge storage film 107 is an insulating silicon nitride film (SiN film), for example, formed on the tunnel oxide film 108 for storing charge. The blocking layer 106 is a multilayered film (ONO film) having layers of a first oxide film, a nitride film and a second oxide film, for example, formed between the charge storage film 107 and the gate electrode 104 with a thickness 5 nm or larger but 15 nm or smaller. Thus, the semiconductor circuit 100 has a structure in which a nitride film is formed in the blocking layer of a SONOS (silicon oxide nitride oxide semiconductor) transistor (memory transistor), and has a function of storing charge in a trap in a nitride film (charge storage film) between the tunnel oxide film and the blocking layer to retain values. The semiconductor circuit 100 has a threshold voltage Vth changing with the amount of charge stored in the charge storage film 107, and the value of the threshold voltage Vth is maintained while the amount of charge is maintained. A process of storing charge in the semiconductor circuit 100 is writing to the semiconductor circuit 100.

Furthermore, the semiconductor circuit 100 is provided with a plurality of nodes (not illustrated) allowing external application of voltage so that the source 102 and the drain 103 are switched with each other and allowing detection of a gate voltage, a drain current and a substrate current as will be described later. Voltage is applied to the semiconductor circuit 100 so that the source and the drain are switched with each other between during charge storage (writing) and during operation.

In general, when the random variation in threshold voltage Vth of a transistor is represented by $\sigma$Vth, a gate length is represented by L and a gate width is represented by W, $\sigma$Vth is proportional to $-\frac{1}{2}$ power of LW. Thus, the variation in Vth of a transistor is larger as the transistor is miniaturized.

Examples of the method for storing charge in the semiconductor circuit 100 includes a method using FN tunnel injection and a method using a hot carrier generated by impact ionization (collision ionization) at a drain. In order to cause FN tunnel injection, a high voltage of about 10 V is typically required, and a booster circuit for boosting the power supply voltage is required. In contrast, the method using a hot carrier is advantageous in that writing (charge storage) is possible at the power supply voltage and a booster circuit is not required.

In the semiconductor circuit 100, voltage is applied to the gate electrode 104, current then flows between the drain and the source, and charge is thus stored. As mentioned above, the drain and the source of the semiconductor circuit 100 are reversed during operation and during writing. Furthermore, the drain voltage Vds of the semiconductor circuit 100 is set to the power supply voltage, for example, during writing while the drain voltage Vds thereof is set to be lower than the power supply voltage during circuit operation so that unintended writing to the charge storage film 107 is prevented.

In order to eliminate the variation in the threshold voltage of the semiconductor circuit 100, it is assumed that adjustment by a maximum of about 30 mV that is a typical standard deviation value of the variation in the threshold voltage is required. Furthermore, after adjustment of the threshold voltage of the semiconductor circuit 100, it is required that the shift amount of threshold voltage as a result of operation be within 1 mV and that the operation be guaranteed for further 10 years.

Figure 2:
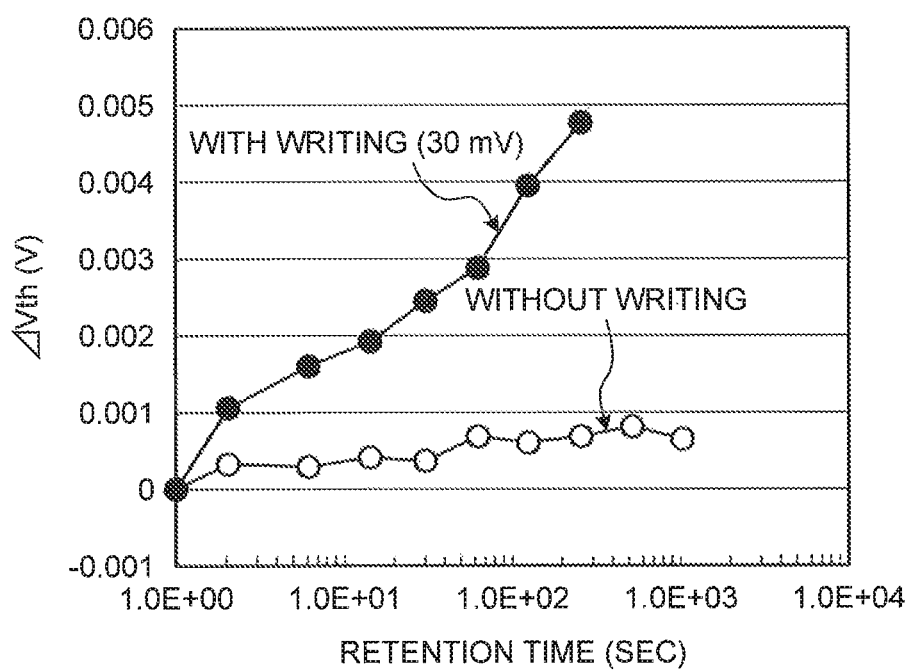
FIG. 2 is a graph illustrating variation in the threshold voltage with the operation of the semiconductor circuit having a blocking layer with a thickness of 6 nm before and after adjusting the threshold voltage of the semiconductor circuit.

Next, variation in threshold voltage due to operation of the semiconductor circuit 100 will be described. FIG. 2 is a graph illustrating variation in threshold voltage Vth due to operation at 85° C. after adjusting the threshold voltage of the semiconductor circuit 100 having a blocking layer 106 with a thickness of 6 nm. Here, the conditions under which voltage is applied during operation of the semiconductor circuit 100 are an overdrive voltage Vod of 0.4 V and a drain voltage Vd of 0.1 V. The overdrive voltage Vod is a value in a range of the drain-source voltage at which the semiconductor circuit 100 operates normally.

As illustrated in FIG. 2, when the semiconductor circuit 100 is made to operate after writing is performed so that the threshold voltage of the semiconductor circuit 100 is shifted by 30 mV, Vth is shifted in the positive direction with time from the start of the operation (the initial stage of the operation).

In contrast, when the semiconductor circuit 100 is made to operate without shifting the threshold voltage of the semiconductor circuit 100 (without writing), Vth changes little with elapse of time from the start of the operation (the initial stage of the operation).

Thus, an "erroneous writing phenomenon" that is unintended writing has occurred in the semiconductor circuit 100 of FIG. 2. It is also considered that the variation in Vth is enhanced by writing to the semiconductor circuit 100. This characteristic is totally unacceptable since the target of the retention characteristics of the semiconductor circuit 100 is that the variation in Vth is within 1 mV even after operation for ten years as mentioned above.

Figure 3:
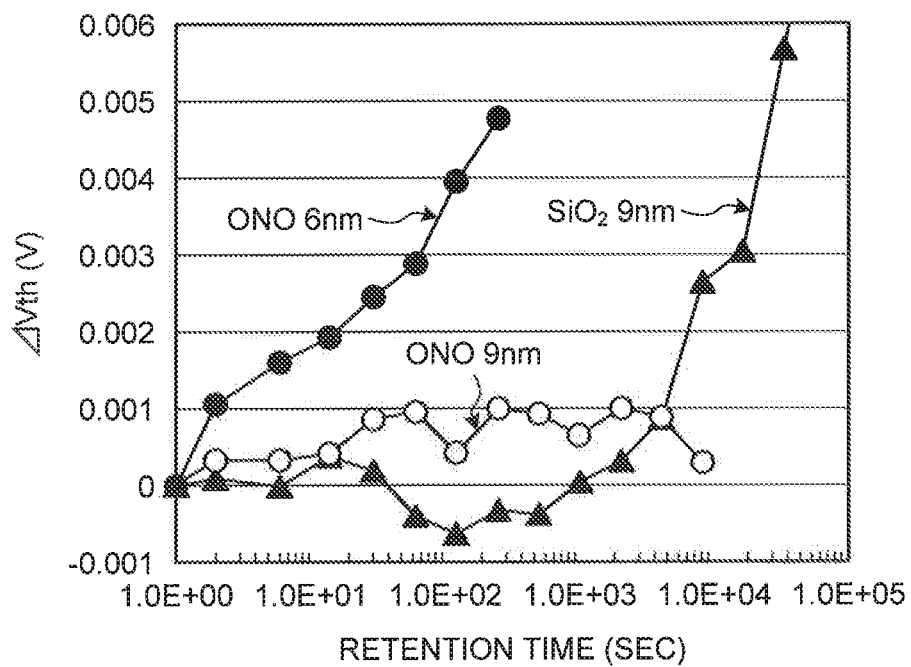
FIG. 3 is a graph illustrating variation the threshold voltage with the operation of the semiconductor circuit before and after adjusting the threshold voltage for each thickness and type of the blocking layer.

FIG. 3 is a graph illustrating variation in threshold voltage Vth due to operation at 85° C. after adjusting the threshold voltage of the semiconductor circuit 100 for each thickness (type) of the blocking layer 106. FIG. 3 illustrates a semiconductor circuit 100 having a blocking layer (ONO film) 106 with a thickness of 6 nm, and a semiconductor circuit 100 having a blocking layer (GPO) 106 with a thickness of 9 nm. The difference between the semiconductor circuits is only the thickness of the blocking layer 106. For comparison, variation in threshold voltage Vth in a case where the blocking layer 106 is replaced by $SiO_2$ with a thickness of 9 nm is also illustrated.

As illustrated in FIG. 3, it is found that the erroneous writing phenomenon observed in the blocking layer 106 with a thickness of 6 nm is reduced even only by increasing the thickness to 9 nm. Furthermore, it can also be seen that with a film made only of $SiO_2$, the erroneous writing phenomenon still occurs even if the thickness is 9 nm although the progress of the erroneous writing phenomenon is slower than the case of the blocking layer 106 of 6 cm. These results show that "the thickness of the blocking layer 106 is to be increased" and that "the presence of a nitride film is necessary in the blocking layer 106" in order to reduce the erroneous writing phenomenon.

It is considered that the erroneous writing phenomenon described above is caused by damage to the semiconductor circuit 100 during writing. That is, it is considered that some structural change event occurs in the semiconductor circuit 100 during writing operation.

Figure 4:
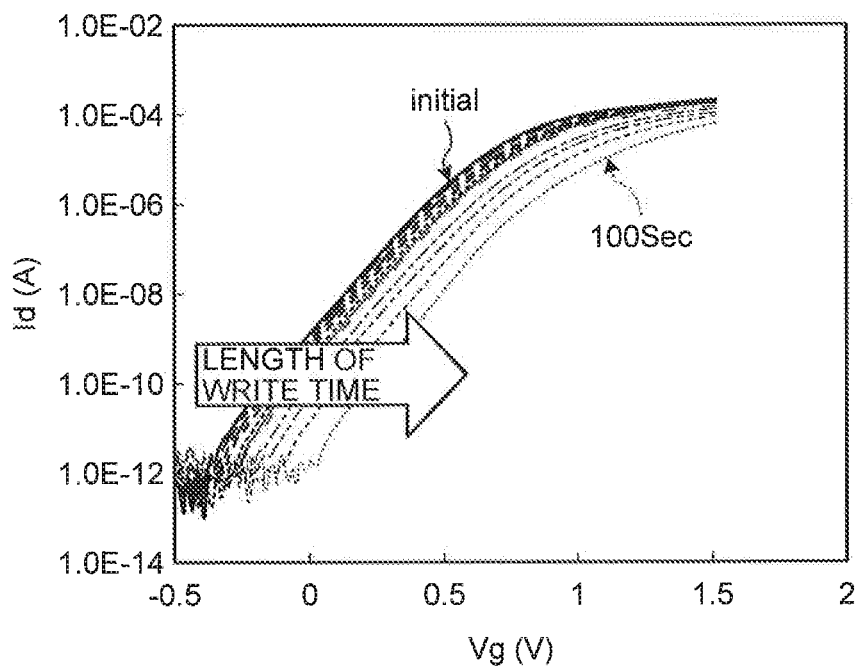
FIG. 4 is a graph illustrating drain current-gate voltage characteristics of the semiconductor circuit having a blocking layer with a thickness of 6 nm depending on write time.

FIG. 4 is a graph illustrating drain current-gate voltage (Id-Vg) characteristics of the semiconductor circuit 100 having the blocking layer 106 with a thickness of 6 nit depending on write time. In FIG. 4, switching characteristics in a case in which the write time is changed from 0 seconds (initial) to 100 seconds are illustrated. FIG. 4 illustrates switching characteristics when write time is 0 seconds (initial), 1, 3, 10, 30, 100, and 300 μsec, 1, 3, 10, 30, 100, and 300 msec, and 1, 3, 3.6, 10, 16, 30, 36, 56, and 100 sec in this order from the left. As can be seen in FIG. 4, the rise of the drain current Id of the semiconductor circuit 100 becomes less sharp and the switching characteristics thereof are degraded as the write time is longer.

Accordingly, the degradation of the semiconductor circuit 100 is quantified by measuring mutual conductance (gm=dId/dVg) for each write time and checking the rate of change in the mutual conductance.

Figure 5:
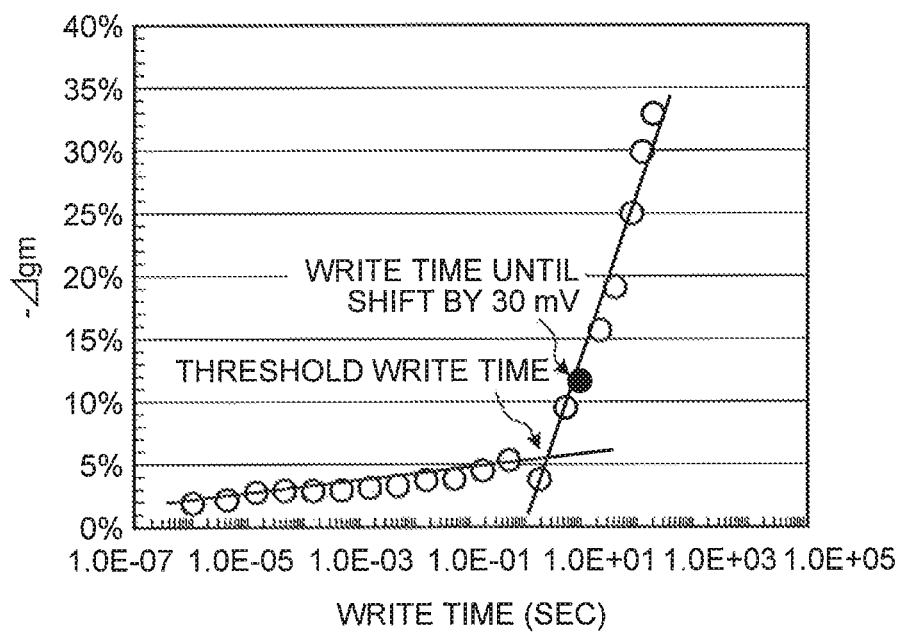
FIG. 5 is a graph illustrating the amount of degradation in gm with respect to write time of the semiconductor circuit having a blocking layer with a thickness of 6 nm.

FIG. 5 is a graph illustrating the amount of degradation in gm with respect to write time of the semiconductor circuit 100 having the blocking layer 106 with a thickness of 6 nm. In FIG. 5, $\Delta$gm is calculated by the following equation (1).

$$\Delta gm = \{gm(\text{after writing}) - gm(\text{initial})\}/gm(\text{initial}) \quad (1)$$

In FIG. 5, the vertical axis represents $-\Delta$gm, and the amount of degradation of the semiconductor circuit 100 is larger as this value is larger. As illustrated in FIG. 5, the degradation of the semiconductor circuit 100 is dependent on the length of write time. Furthermore, the progress of the degradation of the semiconductor circuit 100 suddenly changes at certain time as a threshold.

In the semiconductor circuit 100 (the blocking layer 106 with a thickness of 6 nm) illustrated in FIG. 5, the intersection between two lines illustrated in the figure is assumed to be a "threshold write time (threshold degradation time)". Herein, the threshold write time is about 1 second. In the meantime, in the semiconductor circuit 100 illustrated in FIG. 5, the write time required to shift the threshold by 30 mV is significantly longer than the "threshold write time".

Thus, in the example illustrated in FIG. 2, it can be deemed that the erroneous writing phenomenon occurred because the "threshold write time" is exceeded after the threshold of the semiconductor circuit 100 is shifted by 30 mV. It is thus necessary not to exceed the "threshold write time" in writing in order that the semiconductor circuit 100 has good retention characteristics during operation. Note that the "threshold write time" varies depending on conditions (such as applied voltage) of writing to the semiconductor circuit 100. Thus, the "threshold write time" mentioned above will be described later as being expressed by the total amount of charge flowing through the substrate 101 of the semiconductor circuit 100.

Figure 6:
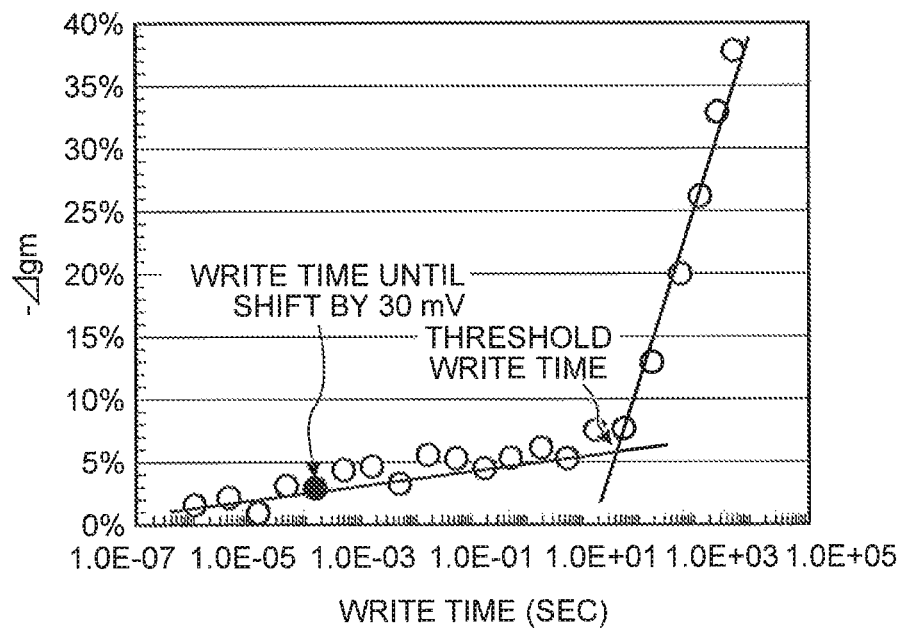
FIG. 6 is a graph illustrating the amount of degradation in gm with respect to write time of the semiconductor circuit having a blocking layer with a thickness of 9 nm.

FIG. 6 is a graph illustrating the amount of degradation (change rate) in gm with respect to write time of the semiconductor circuit 100 having the blocking layer 106 with a thickness of 9 nm. As illustrated in FIG. 6, when the thickness of the blocking layer 106 is increased to 9 nm, the threshold write time that is about 1 second in FIG. 5 becomes as long as about 30 seconds. This is considered to be because injection of hot holes due to anode hole injection and therefore damage to films are suppressed as a result of the increase in the thickness of the blocking layer 106.

Furthermore, in the semiconductor circuit 100 (the blocking layer 106 with a thickness of 9 nm) illustrated in FIG. 6, the write time required to shift the threshold by 30 mV is also shortened. Thus, as illustrated in FIG. 6, the threshold of the semiconductor circuit 100 is shifted by 30 mV in write time that is significantly shorter than the threshold write time. It can be considered here that the electrons moving from the charge storage film 107 to the gate electrode 104 of the semiconductor circuit 10 are reduced and the write efficiency is thus increased as a result of the increase in the thickness of the blocking layer 106.

The results illustrated in FIGS. 5 and 6 can be deemed to explain the variations in the threshold voltage Vth that are different depending on the thickness of the blocking layer 106 illustrated in FIG. 3. Specifically, it can be considered that in the semiconductor circuit 100 having the blocking layer 106 with a thickness of 6 nm and completing adjustment of threshold by 30 mV after exceeding the threshold write time, electrons are introduced from a channel to the charge storage film 107 as a result of an increase in the interface state suggested by the degradation in gm and an increase in leakage current during the operation after threshold adjustment, resulting in occurrence of the erroneous write phenomenon.

Considering that the erroneous write phenomenon occurs when the blocking layer 106 is replaced with the one with a thickness of 9 nm as illustrated in FIG. 3, it is considered that the nitride film in the blocking layer 106 contributes to suppression of travelling of carriers with a carrier trap and inactivation due to recombination of holes and electrodes to suppress damage due to writing.

Furthermore, in order to clarify the relationship between the degradation phenomenon of the semiconductor circuit 100 depending on write time and the thickness of the blocking layer 106, the amount of degradation (rate of change) in gm with respect to write time is also illustrated for a semiconductor circuit 100 having a blocking layer 106 with a further increased thickness.

Figure 7:
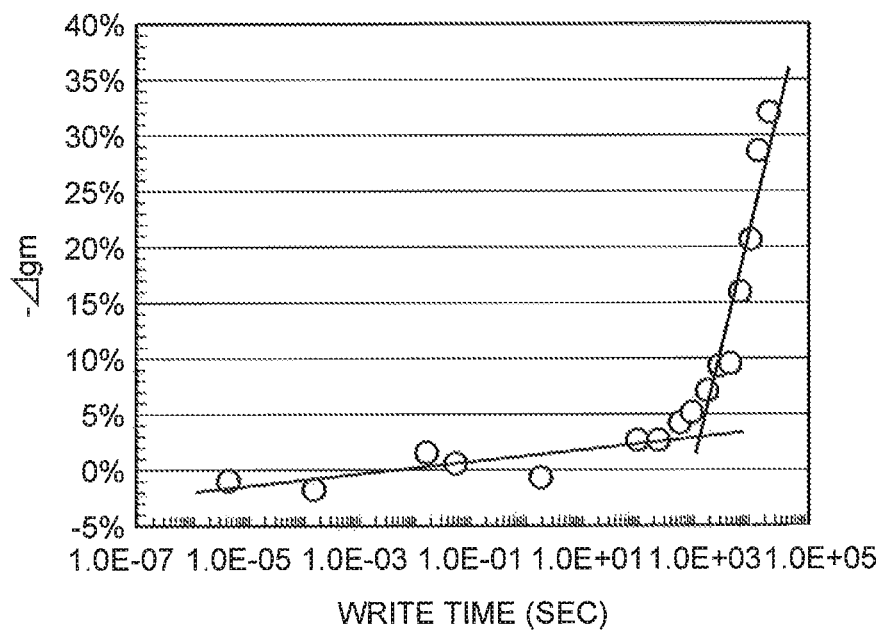
FIG. 7 is a graph illustrating the amount of degradation in gm with respect to write time of the semiconductor circuit having a blocking layer with a thickness of 15 nm.

FIG. 7 is a graph illustrating the amount of degradation (rate of change) in gm with respect to write time of the semiconductor circuit 100 having a blocking layer 106 with a thickness of 15 nm. As illustrated in FIG. 7, when the thickness of the blocking layer 106 is 15 nm, the threshold write time is estimated to be about 1,000 seconds.

From the graphs illustrated in FIGS. 5 to 7, the relationship between the blocking layer 106 and write time with which no erroneous writing phenomenon occur during operation can be obtained. In order to generalize this relationship, the relation between the thickness of the blocking layer 106 and the substrate charge amount (Qsub: total charge amount) that is an index of impact ionization occurring during writing. The substrate charge amount Qsub is represented by a product of substrate current Isub flowing through the substrate 101 during writing and the write time.

Figure 8:
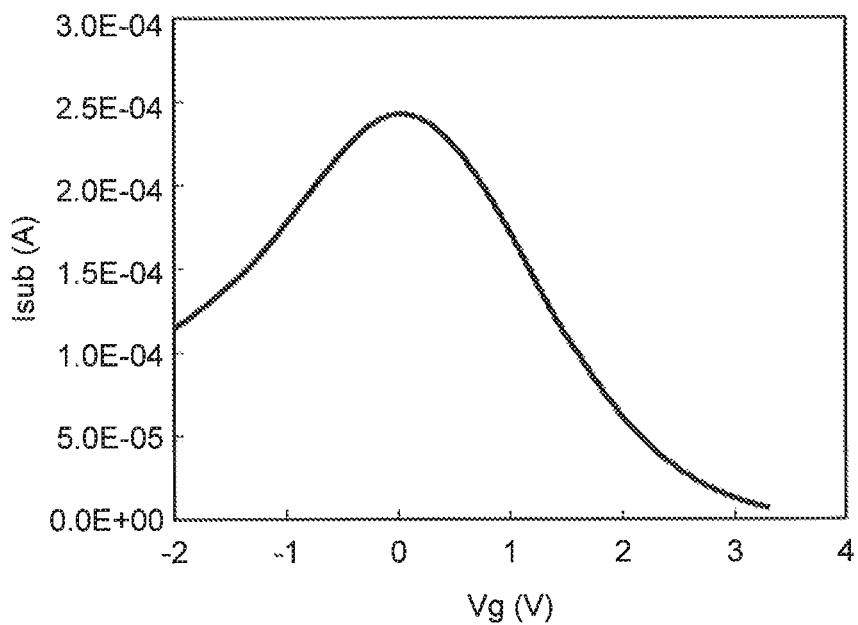
FIG. 8 is a graph illustrating the relationship (Isub-Vg characteristics) between the substrate current and the gate voltage when the drain voltage Vd of the semiconductor circuit having a blocking layer with a thickness of 9 nm is 3.3 V.

FIG. 8 is a graph illustrating the relationship (Isub-Vg characteristics) between the substrate current and the gate voltage when the drain voltage Vd of the semiconductor circuit 100 having a blocking layer 106 with a thickness of 9 nm is 3.3 V. The write efficiency of the semiconductor circuit 100 is maximum when the gate voltage Vg is 0.2 V as illustrated in FIG. 8, for example. When the gate voltage Vg applied to the semiconductor circuit 100 is 0.2 V, the substrate Isub is 2.4E-4(A).

When the thickness of the blocking layer 106 is 9 nm and if the threshold write time is about 30 seconds (see FIG. 6), the substrate charge amount Qsub (=Isub×write time) flowing through the substrate 101 until the aforementioned threshold write time is 2.4E-4 (A)×30 (sec)=7.2E-3(C). Thus, the substrate charge amount Qsub of 7.2E-3(C) is an upper limit of the total charge amount that can be stored in the charge storage film 107 without suddenly chancing the progress of degradation of the semiconductor circuit 100.

Figure 9:
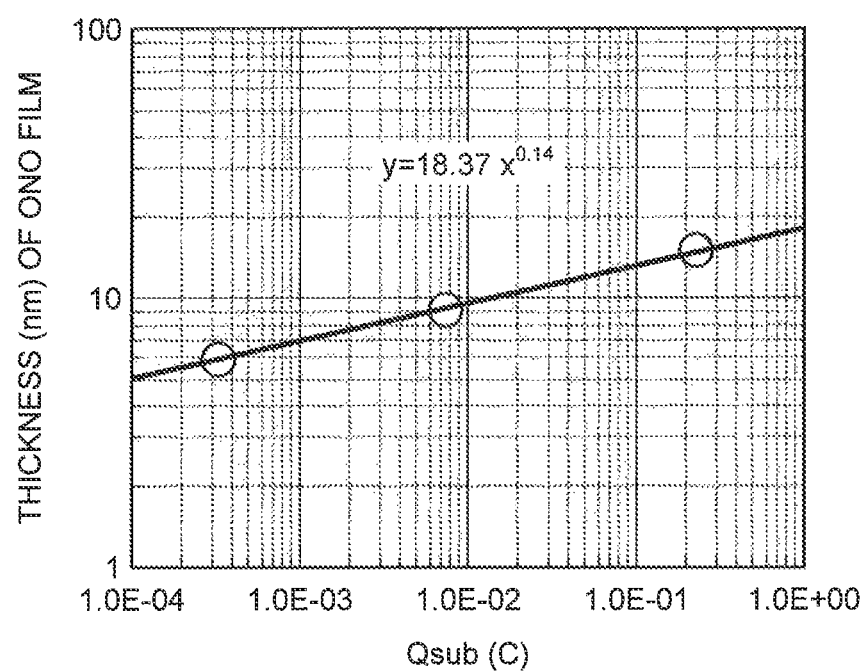
FIG. 9 is a graph illustrating the relationship between each of blocking layers with different thicknesses and the substrate charge amount.

FIG. 9 is a graph illustrating the relation between the blocking layers 106 having different thicknesses (ONO films respectively having thicknesses of 6, 9 and 15 nm) and the substrate charge amount Qsub. In FIG. 9, the condition under which no erroneous writing phenomenon occurs during operation of the semiconductor circuit 100 is defined as a range over an approximate curve $y=18.37x^{0.14}$.

The thickness of the blocking layer 106 is preferably 15 nm or smaller so that driving power as a transistor is obtained, and preferably 5 nm or larger so that movement of charge due to direct tunneling is prevented.

Figure 10:
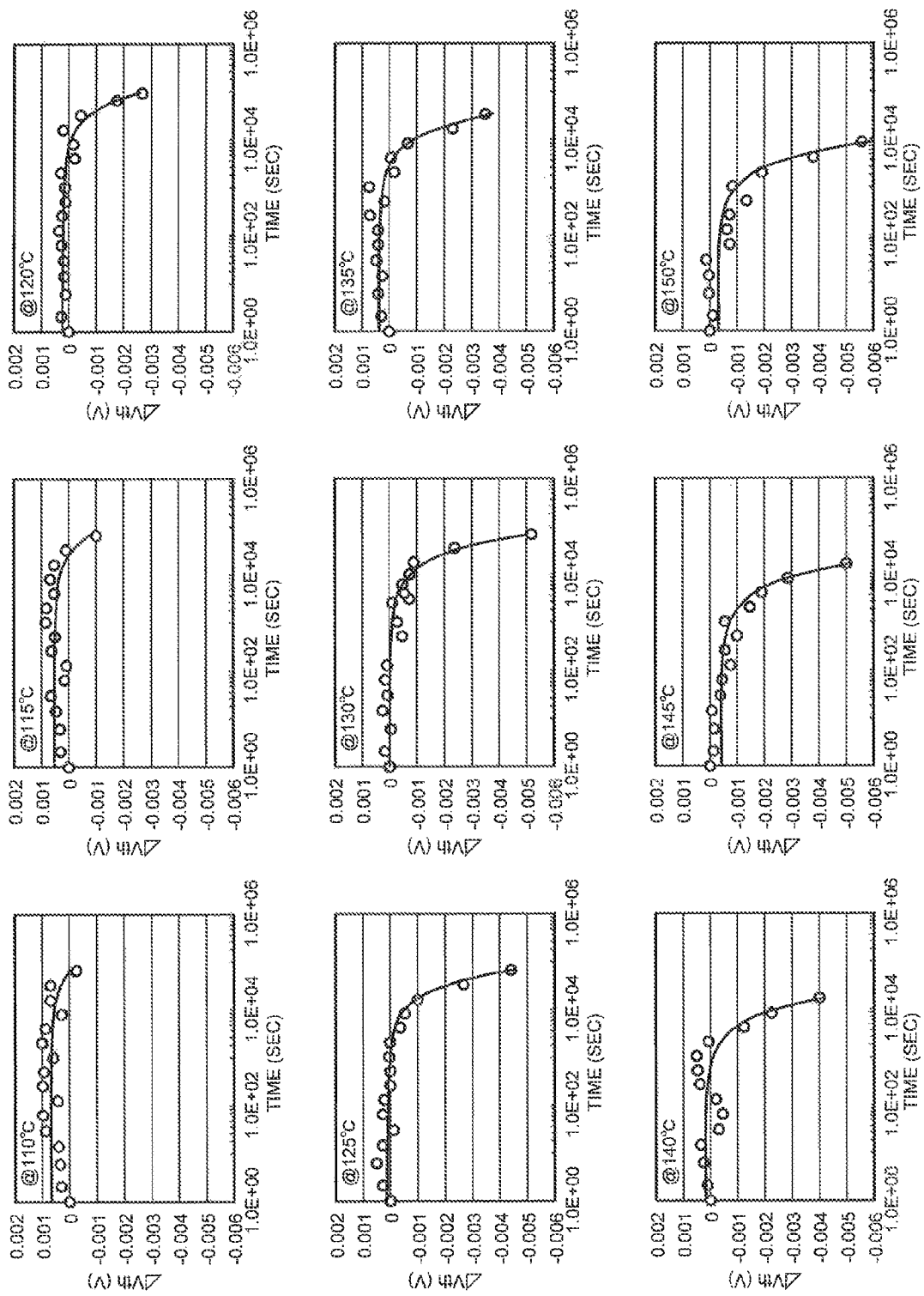
FIG. 10 illustrates graphs each illustrating a result of lifetime evaluation on the retention characteristics during operation of the semiconductor circuit for each measurement temperature.

Next, the lifetime of the retention characteristics during operation of the semiconductor circuit 100 will be described. FIG. 10 illustrates graphs each illustrating a result of lifetime evaluation on the retention characteristics during operation of the semiconductor circuit 100 for each measurement temperature. Note that the lifetime evaluation illustrated in FIG. 10 is obtained by conducting temperature acceleration tests on the semiconductor circuit 100 having a blocking layer 106 with a thickness of 9 nm. Nine measurement temperatures in the range of 110 to 150° C. are used.

It is known that the proportion ($f^-$) of trap in SiN negatively charged after certain time ($\Delta t$) is expressed by the following equation (2) (A. Arreghini et al., Long term charge retention dynamics of SONOS cells, Solid-State Electronics 52 (2008) 1460-1466).

$$f^-(\Delta t) = f^-(0) \cdot e^{-A\Delta t} \quad (2)$$

In the equation, A represents a constant determined by the trap depth, the conduction band offset at the $SiO_2$/SiN interface, the temperature, and the like. In this manner, the amount of charge discharged from the storage layer (the change in Vth) is approximated by an exponential function with respect to time. In FIG. 10, the behavior of the measured data with respect to time is thus approximated by an exponential function.

Figure 11:
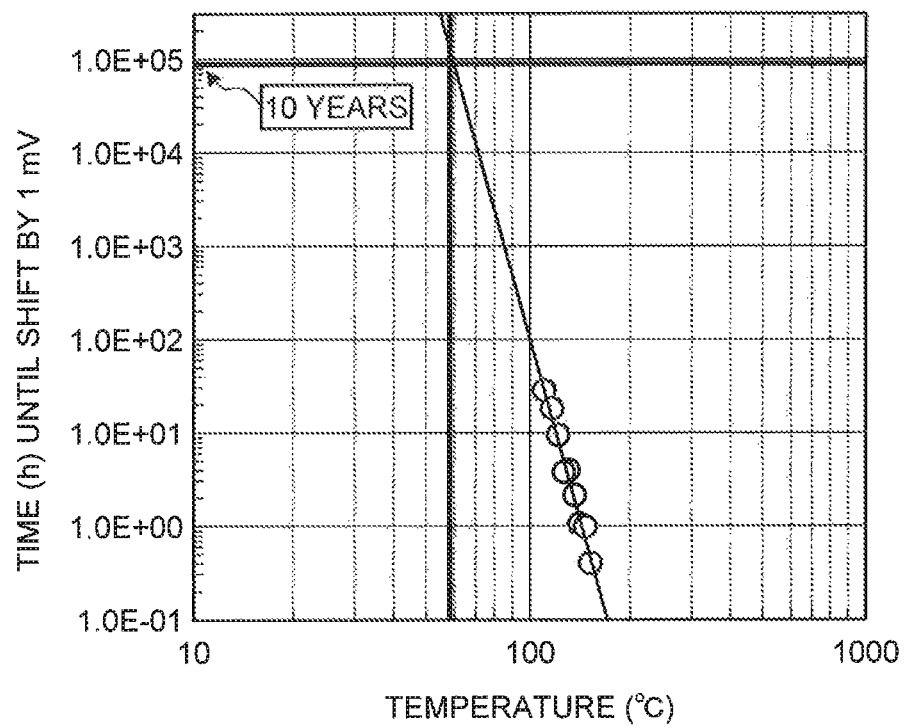
FIG. 11 is a graph illustrating a result of calculating the time (retention time) until the threshold voltage is shifted by 1 mV in the negative direction at each measurement temperature based on approximate curves illustrated in FIG. 10.

FIG. 11 is a graph illustrating a result of calculating the time (retention time) until the threshold voltage is shifted by 1 mV in the negative direction at each measurement temperature based on the approximate curves illustrated in FIG. 10. The retention time until the threshold voltage Vth is shifted by 1 mV and the measurement temperature well follow the power law. As a result of approximating the plots illustrated in FIG. 11 by a power function (that is a function that is linear in a double logarithmic graph), the temperature in a case where an extrapolated curve thereof is ten years significantly exceeds the room temperature. In other words, this shows that the operation of the semiconductor circuit 100 can be compensated even if the state in which the semiconductor circuit 100 is in operation at room temperature, for example, continues for ten years.

First Example

Figure 12:
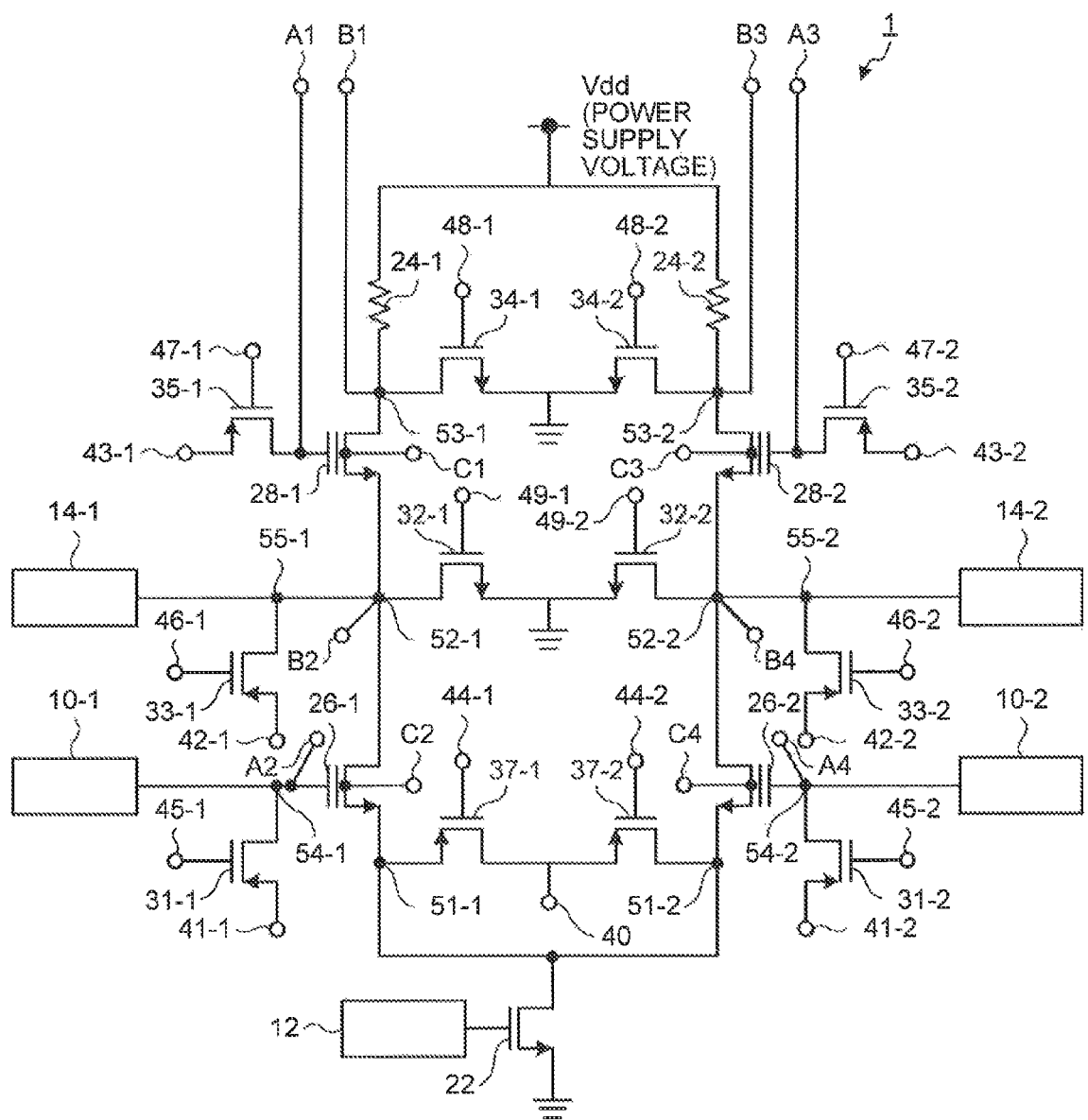
FIG. 12 is a diagram illustrating an exemplary configuration of a mixer circuit having a plurality of pairs of semiconductor circuits according to the embodiment.

Next, a first example of circuitry having the semiconductor circuit 100 will be described. FIG. 12 is a diagram illustrating an exemplary configuration of a mixer circuit 1 having a plurality of pairs of semiconductor circuits 100 according to the embodiment. As illustrated in FIG. 12, the mixer circuit 1 is a single balanced mixer and includes differential input nodes 10-1 and 10-2, an input node 12, output nodes 14-1 and 14-2, an nMOS transistor 22, load resistors 24-1 and 24-2, transistors 26-1 and 26-2, and transistors 28-1 and 28-2, for example. The transistors 26-1 and 26-2 and the transistors 28-1 and 28-2 have the same structure as the semiconductor circuit 100 illustrated in FIG. 1. When certain one of a plurality of components such as the transistors 26-1 and 26-2 is referred to without specifying which of the components, the component may be simply referred to as a "transistor 26" or the like.

The mixer circuit 1 is used for frequency conversion of RF (radio frequency) signals in a receiving circuit (see FIG. 14) of a radio communication device, for example. For example, when the mixer circuit 1 to which power supply voltage (Vdd) is applied is used in a direct conversion receiving circuit, a local signal LO (local oscillator) having a frequency f1 is differentially input to the differential input nodes 10-1 and 10-2 from a local oscillator. The differential signals of the local signal LO are respectively input to gate terminals of the transistors 26-1 and 26-2.

An RF signal having a frequency f2 that is equal to or very close to the frequency f1 is input to the input node 12. The RF signal is input to a gate terminal of the nMOS transistor 22. Note that the load resistors 24-1 and 24-2 and the transistors 28-1 and 28-2 lower the power supply voltage applied to the transistors 26-1 and 26-2, respectively.

The mixer circuit 1 then mixes the differential signals of the local signal LO and the RE signal, and outputs differential signals having frequencies f2±f1 (if f2>f1; frequencies f1±f2 if f2<f1) from the output nodes 14-1 and 14-2. In the direct conversion method, a signal having a frequency f2−f1, for example, is used as a baseband signal.

The transistors 28-1 and 28-2 are provided to resolve the variation in resistance of the load resistors 24-1 and 24-2 arranged as a pair. For example, since the threshold voltage Vth of the transistor 28 varies with the amount of change stored in the charge storage, film 107, the on-resistance thereof varies. It is thus possible to eliminate the influence, of the variation of the load resistors 24-1 and 24-2 by adjusting the on-resistance of at least either one of the transistors 28-1 and 28-2.

Furthermore, the mixer circuit 1 is provided with pMOS transistors 31-1, 31-2, 33-1, 33-2, 35-1, 35-2, 37-1, and 37-2. The mixer circuit 1 is also provided with nMOS transistors 32-1, 32-2, 34-1, and 34-2.

The mixer circuit 1 also includes nodes 40, 41-1 to 49-1, and 41-2 to 49-2 that can be connected to external circuits, and nodes 51-1 to 55-1, and 51-2 to 55-2 that are internal nodes. For example, potentials of the nodes 40, 41-1 to 49-1, and 41-2 to 49-2 can be changed to any values in a range from the power supply voltage to ground by external control. Furthermore, the nodes 40, 41-1 to 49-1, and 41-2 to 49-2 are respectively set to different potentials between during writing and during circuit operation.

The pMOS transistor 31 has a gate terminal to which the node 45 is connected, and a drain terminal, when the power supply voltage, etc., is applied to the node 41, connected to the gate terminal of the transistor 26 at the node 54.

The pMOS transistor 33 has a gate terminal to which the node 46 is connected, and a drain terminal, when the power supply voltage, etc., is applied to the node 42, connected to the output node 14 at the node 55.

The pMOS transistor 35 has a gate terminal to which the node 47 is connected, and a drain terminal, when the power supply voltage, etc., is applied to the node 43, connected to the gate terminal of the transistor 28.

The pMOS transistor 37 has a gate terminal to which the node 44 is connected, and a drain terminal, when the power supply voltage, etc., is applied to the node 40, connected to the drain terminal of the nMOS transistor 22 at the node 51.

The nMOS transistor 32 has a gate terminal, to which the node 49 is connected, and a drain terminal connected to the node 52 positioned between the transistor 26 and the transistor 28. Note that the potentials of the node 55 and the node 52 are equal.

The nMOS transistor 34 has a gate terminal to which the node 48 is connected, and a drain terminal connected to the node 53 positioned between the low potential side of the load resistor 24 and the transistor 28.

Next, an example of operation for writing (charge storage, threshold voltage adjustment) to the transistor 26 will be described. When the power supply voltage (3.3 V, for example) is applied to the node 40 and the node 44 is set to 0 V, the pMOS transistor 37 is turned on and the potential of the node 51 becomes approximately equal to the power supply voltage level. Furthermore, when the power supply voltage is applied to the node 49, the nMOS transistor 32 is turned on and the potential of the node 52 becomes approximately equal to the ground level.

When the power supply voltage is applied to the node 41 and the node 45 is set to 0 V in this state, the pMOS transistor 31 is turned on and voltage approximately equal to the power supply voltage is applied to the gate terminal of the transistor 26.

When the transistor 26 operates in this manner, hot carriers are generated by impact ionization at the drain (an the side of the node 51) of the transistor 26, electrons are trapped in the charge storage film 107 (FIG. 1) and the threshold voltage Vth changes. At this point, the voltage applied to the gate terminal of the transistor 26 may be at any level equal, to or lower than the power supply voltage and may be changed as appropriate so as to efficiently cause impact ionization.

After changing the threshold voltage Vth of the transistor 26, the operator makes the mixer circuit 1 operate to measure second-order distortion. The operator then adjusts the threshold voltage Vth of the transistor 26 until the second-order distortion during circuit operation of the mixer circuit 1 is reduced to a desired value. In other words, the degradation in the characteristics due to variation or the transistors 26-1 and 26-2 can be reduced by adjusting the threshold voltage Vth of at least either one of the transistors 26-1 and 26-2. Note that the adjustment of the threshold voltage Vth is not limited to that by actually measuring the second-order distortion but may be performed by other methods such as by directly measuring the threshold voltage Vth.

The threshold voltage Vth changes with the amount of charge stored in the charge storage film 107, and the value of the threshold voltage Vth is maintained while the amount of charge is maintained. Accordingly, when the mixer circuit 1 operates after the threshold voltage Vth is adjusted, potentials that do not allow writing to the charge storage film 107 of the transistor 26 are set at the nodes 51, 52 and 54. For example, in relation to the transistor 26, a node that serves as a source is set to 0 V, a node that serves as a drain is set to 0.1 V, and a node that serves as a gate is set to 0.8 V.

Next, an example of operation for writing (charge storage, threshold voltage adjustment) to the transistor 28 will be described. When the power supply voltage (3.3 V, for example) is applied to the node 42 and the node 46 is set to 0 V, the pMOS transistor 33 is turned on and the potential of the nodes 55 and 52 becomes approximately equal to the power supply voltage level. Furthermore, when the power supply voltage is applied to the node 48, the nMOS transistor 34 is turned on and the potential of the node 53 becomes approximately equal to the ground level.

When the power supply voltage is applied to the node 43 and the node 47 is set to 0 V in this state, the pMOS transistor 35 is turned on and voltage approximately equal to the power supply voltage is applied to the gate terminal of the transistor 28.

When the transistor 28 operates in this manner, hot carriers are generated by impact ionization at the drain (on the side of the node 52) of the transistor 28, electrons are trapped in the charge storage film 107 (FIG. 1) and the threshold voltage Vth (that is, on-resistance) changes. At this point, the voltage applied to the gate terminal of the transistor 28 may be at any level equal to or lower than the power supply voltage and may be changed as appropriate so as to efficiently cause impact ionization.

After changing the threshold voltage Vth of the transistor 28, the operator makes the mixer circuit 1 operate to measure second-order distortion. The operator then adjusts the threshold voltage Vth of the transistor 28 until the second-order distortion during circuit operation of the mixer circuit 1 is reduced to a desired value. In other words, the degradation in the characteristics due to variation of the load resistors 24-1 and 24-2 can be reduced by adjusting the threshold voltage Vth of at least either one of the transistors 28-1 and 28-2. Note that the adjustment of the threshold voltage Vth is not limited to that by actually measuring the second-order distortion but may be performed by other methods soon as by directly measuring the threshold voltage Vth.

As described above, the on-resistance (threshold voltage Vth) changes with the amount of charge stored in the charge storage film 107, and the value of the threshold voltage Vth is maintained while the amount of charge is maintained. Accordingly, when the mixer circuit 1 operates after the on resistance is adjusted, potentials that do not allow writing to the charge storage film 107 of the transistor 28 are set at the nodes 43, 47, 52 and 53. For example, in relation to the transistor 28, a node that serves as a source is set to 0 V, a node that serves as a drain is set to 0.1 V, and a node that serves as a gate is set to 0.8 V.

Although the characteristics of the transistors 26 and the transistors 28 are maintained with the amount of charge stored in the charge storage films 107 as described above, the threshold voltages Vth may change as a result of continuous operation as explained with reference to FIGS. 2 to 11.

Accordingly, the transistors 26-1 and 26-2 and the transistors 28-1 and 28-2 are provided with nodes A1 to A4, E1 to B4 and C1 to C4 allowing detection of the gate voltages, the drain currents and the substrate currents. The nodes A1 to A4, B1 to B4 and C1 to C4 are nodes that can be connected to external circuits, and may be internal, nodes of the mixer circuit 1.

For example, the nodes A1 to A4 allow detection of the gate voltages of the transistors 26-1 and 26-2 and the transistors 28-1 and 28-2, respectively. The nodes B1 to B4 allow detection of the drain currents of the transistors 26-1 and 26-2 and the transistors 28-1 and 28-2, respectively. The nodes C1 to C4 allow detection of the substrate currents of the transistors 26-1 and 26-2 and the transistors 28-1 and 28-2 respectively. The mixer circuit 1, however, may be configured in any manner as long as it is possible to detect the gate voltages, the drain currents and the substrate currents of the transistors 26-1 and 26-2 and the transistors 28-1 and 28-2 by using any of all, the nodes and perform writing thereto.

Second Example

Figure 13:
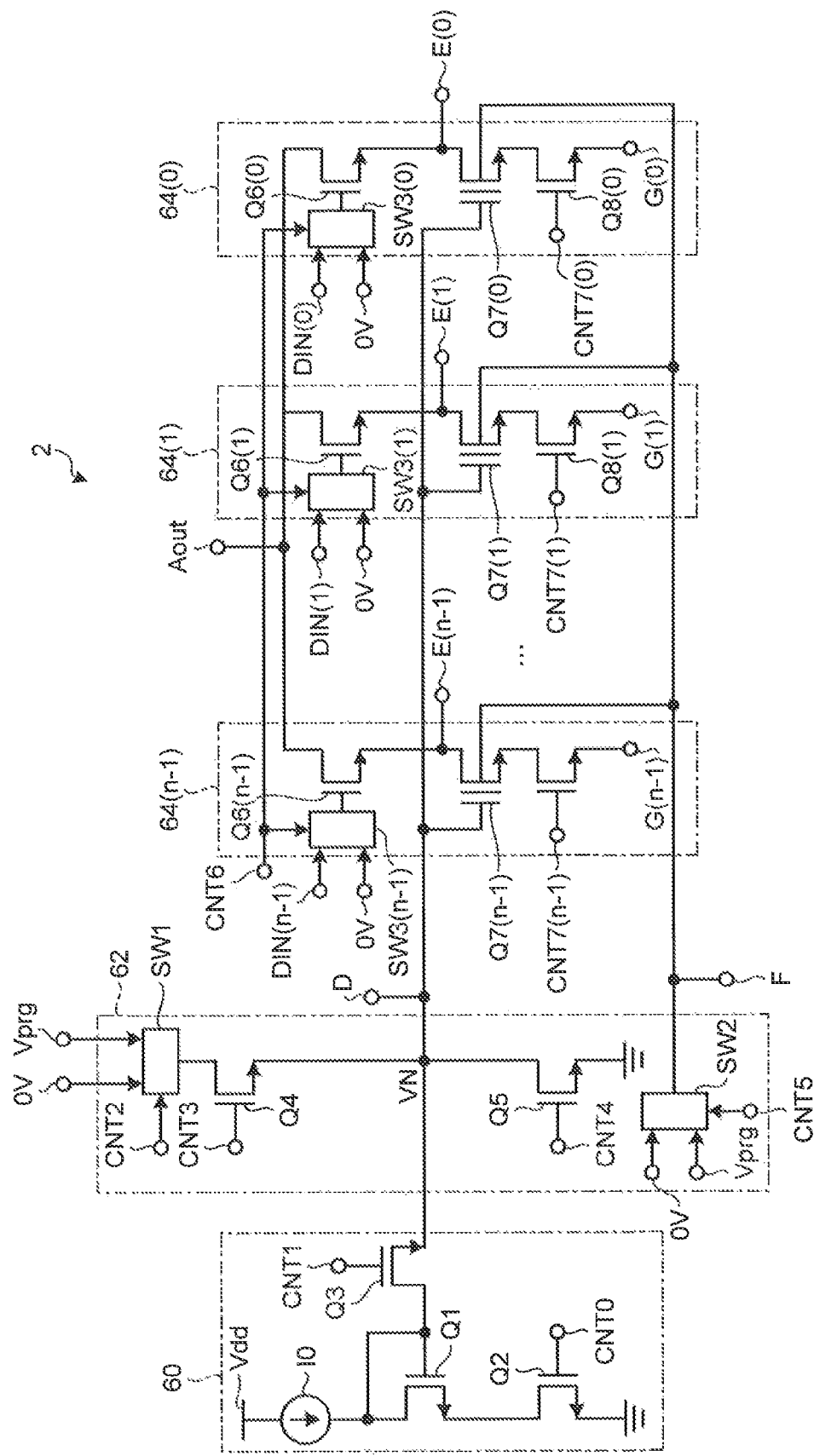
FIG. 13 is a diagram illustrating an exemplary configuration of a D/A converter with multi-bit resolution having a plurality of semiconductor circuits according to the embodiment.

Next, a second example of circuitry having the semiconductor circuit 100 will be described. FIG. 13 is a diagram illustrating an exemplary configuration of a D/A converter 2 with multi-bit resolution having a plurality of semiconductor circuits 100 according to the embodiment. The D/A converter 2 is a current-summing D/A converter configured to convert, an n-bit digital voltage signal DIN input thereto to an analog current signal Aout. The D/A converter 2 includes a current mirror unit 60, a writing unit 62, and n voltage-to-current converting units 64(n−1) to 64(0).

The current mirror unit 60 supplies a predetermined bias voltage to the voltage-to-current converting units 64(n−1) to 64(0). The current mirror unit 60 includes a current source I0 in cascade connection between a power supply terminal for supplying a power supply voltage Vdd of 3.3 V, for example, and a ground terminal for supplying a ground voltage of 0 V, nMOS transistors Q1 and Q2, and an nNOS transistor Q3 connected between the gate of the transistor Q1 and a node VN.

The current source I0 is a pMOS transistor having a gate to which a predetermined voltage is applied, for example. The gate and the drain of the transistor Q1 are connected. The transistor Q2 is a switch subjected to on/off control by a control signal CNT0 input to the gate thereof. When the control signal CNT0 is high, the transistor Q2 is turned on and current flows between the power supply terminal and the ground terminal. The transistor Q3 is a switch subjected to on/off control by a control signal CNT1 input to the gate thereof. When the control signal CNT1 is high, the transistor Q3 is turned, on and the gate voltage of the transistor Q1 is output to the node N.

The writing unit 62 adjusts the threshold voltages of transistors Q7($n$−1) to Q7(0), which will be described later, in the voltage-to-current converting units 64($n$−1) to 64(0) for performing writing using FN tunnel injection, for example. The writing unit 62 includes transistors Q4 and Q5 and switches SW1 and SW2. The switch SW1 supplies 0 V or a write voltage Vprg to the transistor Q4 according to the control of a control signal CNT2. Note that the write voltage Vprg is a voltage equal to or lower than the power supply voltage, for example. When writing is performed by using FN tunnel injection, the write voltage Vprg is set to a voltage higher than the power supply voltage. The transistor Q4 is a switch subjected to on/off control by a control signal CNT3 input to the gate thereof. When the control signal CNT3 is high, the transistor Q4 is turned on and either of the voltages output by the switch SW1 is supplied to the node VN.

The switch SW2 supplies 0 V or a write voltage Vprg to the transistors Q7($n$−1) to Q7(0), which will be described later, according to the control of a control signal CNT5. When writing is performed by using FN tunnel injection, the write voltage Vprg is set to a voltage higher than the power supply voltage. Alternatively, when writing is performed by using hot carriers, the write voltage Vprg is not needed. The transistor Q5 is a switch subjected to on/off control by a control signal CNT4 input to the gate thereof. When the control signal CNT4 is high, the transistor Q5 is turned on and the ground voltage is supplied to the node VN.

The voltage-to-current converting units 64($n$−1) to 64(0) have the same configuration. The voltage-to-current converting unit 64($n$−1) will be described here. The voltage-to-current converting unit 64($n$−1) is configured to generate a predetermined current when a value DIN($n$−1) at an n-th bit of an input digital signal DIN is high. The voltage-to-current converting unit 64($n$−1) includes nMOS transistors Q6($n$−1), Q7($n$−1), and Q8($n$−1) in cascade connection between an output terminal through which an output current Aout is output and a ground terminal G($n$−1), and a switch SW3($n$−1). The value DIN($n$−1) at the n-th bit and 0 V are input to the switch SW3($n$−1), and either of the voltages is output to the gate of the transistor Q6($n$−1) according to the control of a control signal CNT6. The transistor Q6($n$−1) is a switch subjected to on/off control according to the voltage input to the gate thereof.

The transistor Q7($n$−1) has a gate connected to the node VN, and a substrate to which the voltage output from the switch SW2 is supplied. The transistor Q7 ($n$−1) has the same structure as the semiconductor circuit 100 described above. Thus, the transistors Q7($n$−1) to Q7(0) are adjusted to have substantially equal threshold voltages Vth. The transistor Q8($n$−1) is a switch subjected to on/off control according to a control signal CNT7($n$−1). In the D/A converter 2, substrates of pMOS transistors that are not explicitly stated are connected to the bower supply terminal while substrates of nMOS transistors are connected to the ground terminal.

Potentials in the range from the power supply voltage to the ground voltage can be externally supplied to any of the terminals and the nodes connected to the transistors Q7($n$−1) to Q7(0). For example, in the D/A converter 2, the sources and the drains of the respective transistors Q7($n$−1) to Q7(0) during writing can be reversed from those during operation. For example, in the D/A converter 2, it is also possible to apply the power supply voltage Vdd to ground terminals G(n−) to G(0), etc., and ground the output terminal through which the output current Aout is output.

Furthermore, although the characteristics of the D/A converter 2 are maintained with the amount of charge stored in the charge storage films 107 of the transistors Q7($n$−1) to Q7(0) similarly to the mixer circuit 1, the threshold voltages Vth of the transistors Q7($n$−1) to Q7(0) may change as a result of continuous operation as explained with reference to FIGS. 2 to 11.

Accordingly, the transistors Q7($n$−1) to Q7(0) of the D/A converter 2 are provided with nodes D, E($n$−1) to E(0), and F allowing detection of the gate voltages, the drain currents and the substrate currents. The nodes D, E($n$−1) to E(0), and F are nodes that can be connected to external circuits, and may be internal nodes of the D/A converter 2.

For example, the node D allows detection of the gate voltages of the transistors Q7($n$−1) to Q7(0). The nodes E($n$−1) to E(0) allow detection of the drain currents of the transistors Q7($n$−1) to Q7(0), respectively. The node F allows detection of the substrate currents of the transistors Q7($n$−1) to Q7(0). The D/A converter 2, however, may be configured in any manner as long as the it is possible to detect the gate voltages, the drain currents and the substrate currents of the transistors Q7($n$−1) to Q7(0) by using any of all the nodes and terminals (may serve as nodes) and perform writing thereto. Furthermore, each of the transistors Q7($n$−1) to Q7(0) may be individually provided with nodes D and F.

Third Example

Figure 14:
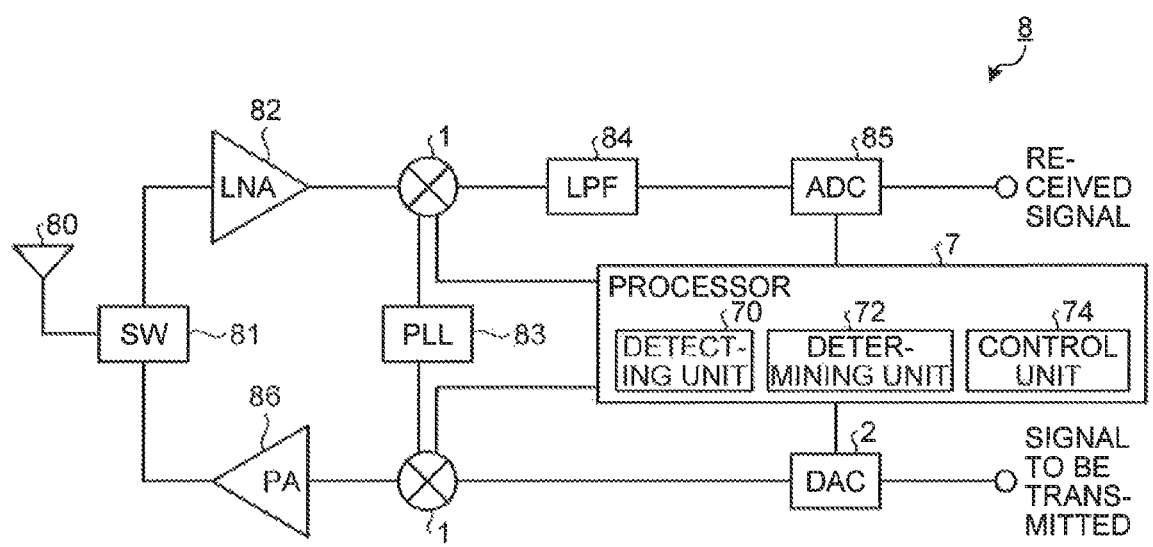
FIG. 14 is a diagram illustrating an outline of a configuration of a direct conversion radio communication device including the mixer circuit and the D/A converter according to the embodiment.

Next, a radio communication device 8 (third example) including the mixer circuit 1 and the D/A converter 2 will be described. FIG. 14 is a diagram illustrating an outline of a configuration of a direct conversion radio communication device 8 including the mixer circuit 1 and the D/A converter 2. As illustrated in FIG. 14, the radio communication device 8 includes an antenna 80, a switch 21, a low-noise amplifier (LNA) 82, a phase locked loop (PLL) 83, two mixer circuits 1, a low-pass filter (LPF) 84, an A/D converter (ADC) 85, a D/A converter (DAC) 2, a power amplifier (PA) 86, and a processor 7. The switch 81, the low-noise amplifier (LNA) 82, the PLL (phase locked loop) 83, the two mixer circuits 1, the low-pass filter (LPF) 84, the A/D converter (ADC) 85, the D/A converter (DAC) 2, the power amplifier (PA) 86, and the processor 7 may each be formed on an individual chip or any combination thereof may be formed on one chip.

The antenna 80 receives a radio wave containing a signal superimposed on a carrier wave. The switch 81 switches between a receiving circuit including the LNA 82, etc., and a transmitting circuit including the PA 86, etc. The LNA 82 amplifies a signal (RF signal) received by the antenna 80 and outputs the amplified signal to a mixer circuit 1. The PLL 83 includes a voltage controlled oscillator (VCO), phase-locks a signal (local signal LO) having a frequency equal to that of the carrier wave, and outputs the resulting signal to the two mixer circuits 1.

The mixer circuit 1 included in the receiving circuit mixes the local, signal LO output from the PLL 83 and the RF signal output from the LNA 82, and outputs the resulting signal to the LPF 84. The mixer circuit 1 included in the transmitting circuit mixes the local signal LO output from the PLL 83 and a signal to be transmitted output: from the D/A converter 2, and outputs the resulting signal to the PA 86.

The LPF 84 receives signals from the mixer circuit 1 and allows a baseband signal to pass there through. The ADC 85 converts the baseband signal from analog to digital. The ADC 85 herein is of a successive approximation type including the D/A converter 2 therein. Thus, the accuracy of A/D conversion of the ADC 85 is determined by the D/A converter 2 illustrated in FIG. 13 included therein.

The D/A converter 2 converts the signal to be transmitted from digital to analog and outputs the resulting signal to the mixer circuit 1 of the transmitting circuit. The PA 86 amplifies the signal to be transmitted.

The processor 7 includes a detecting unit 70, a determining unit 72, and a control unit 74. The detecting unit 70 detects the gate voltages, the drain currents and the substrate currents of transistors capable of adjusting the threshold voltages Vth thereof included in the two mixer circuits 1, the D/A converter 2 and the ADO 85.

The determining unit 72 determines whether or not a threshold voltage Vth changing with the charge stored in the charge storage film (nitride film) 107 has reached a target value and whether or not the total amount of charge flowing through a substrate 101 has reached the upper limit on the basis of the gate voltages, the drain voltages and the substrate voltages detected by the detecting unit 70.

The control unit 74 controls the two mixer circuits 1, the D/A converter 2 and the ADO 85, and controls writing to transistors capable of adjusting the threshold voltages Vth included in the two mixer circuits 1, the D/A converter 2 and the ADO 85. For example, the control unit 74 performs control to make the substrate current flow so that charge is stored in the charge storage film 107 until the determining unit 72 determines that either the target value or the upper limit is reached.

Figure 15:
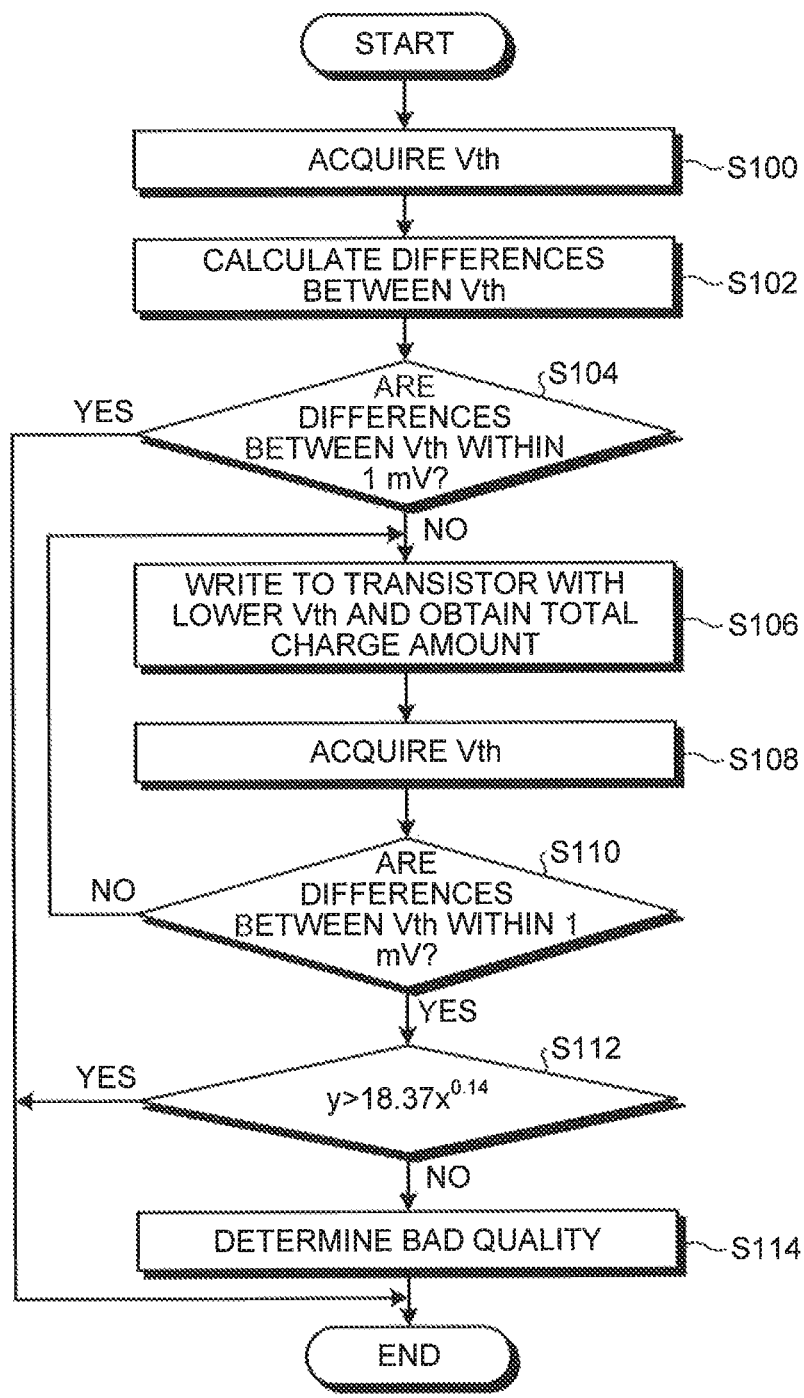
FIG. 15 is a flowchart illustrating a process of adjusting threshold voltages of transistors included in the radio communication device.

Next, a process of adjusting the threshold voltages Vth of the transistors included in the radio communication device 8 will be described. FIG. 15 is a flowchart illustrating the process of adjusting the threshold voltages Vth of the transistors included in the radio communication device 8. Note that the entire process illustrated in FIG. 15 is controlled by the processor 7, for example. Part of or the entire process illustrated in FIG. 15 may be performed by an operator and the processor 7.

In step S100, the detecting unit 70 sequentially acquires (detects) the threshold voltages Vth of the respective transistors included in the radio communication device 8 the threshold voltages Vth being to be adjusted to be substantially equal (the differences between Vth are to be within 1 mV).

In step S102, the control unit 74 sequentially calculates the differences between the threshold voltages Vth detected in step S100.

In step S104, the control unit 74 determines whether or not the differences between the threshold voltages Vth calculated in step S102 are within 1 mV. If the control unit 74 determines that the differences between the threshold voltages Vth calculated in step S102 are within 1 mV (step S104: Yes), the process is terminated. If, on the other hand, the control unit 74 determines that a difference between the threshold voltages Vth calculated in step S102 is not within 1 mV (step S104 No), the process proceeds to step S106.

In step S106, the control unit 74 performs writing to a transistor having a low threshold voltage Vth among the transistors whose threshold voltages Vth are to be substantially equal, and obtains the total amount of charge described above via the detecting unit 70.

In step S108, the control unit 74 acquires the threshold voltage Vth of the transistor to which writing is performed via the detecting unit 70.

In step S110, the determining unit 72 determines whether or not the differences between the threshold voltage Vth of the transistor to which writing is performed and the threshold voltages Vth of transistors whose threshold voltages Vth are to be equal to that of the transistor to which writing is performed are within 1 mV, for example. Note that the criterion for determination on the differences between Vth is arbitrarily determined by the operator. If the determining unit 72 determines that the differences between the threshold voltage Vth acquired in step S108 and the threshold voltages Vth of the transistors whose threshold voltages Vth are to be equal to the acquired threshold voltage Vth are within 1 mV (step S110: Yes), the process proceeds to step S112. If on the other hand, that the determining unit 72 determines that a difference between the threshold voltage Vth acquired in step 1108 and a threshold voltage Vth of a transistor whose threshold voltage Vth is to be equal to the acquired threshold voltage Vth is not within 1 mV (step S110: No), the process proceeds to step S106.

In step S112, the control unit 74 determines whether or not the relation of $y>18.37x^{0.14}$ is satisfied. Note that y represents the thickness of the blocking layer 106. x represents the total amount of charge mentioned above. If the control unit 74 determines that the relation of $y>18.37x^{0.14}$ is satisfied (step S112: Yes), it is deemed that writing is properly performed (determined to be in good quality) and the process is terminated. If, on the other hand, the control unit 74 determines that the relation of $y>18.37x^{0.14}$ is not satisfied (step S112: No), the process proceeds to step S114.

In step S114, the control unit 74 determines the transistor (or the device including the transistor) that is determined not to satisfy the relation of $y>18.37x^{0.14}$ in step S112 as being not good (determined to be in bad quality).

Note that the processor 7 sequentially adjusts the threshold voltages Vth of combinations of transistors whose threshold voltages Vth are to be substantially equal (the differences between Vth are to be within 1 mV) included in the radio communication device 8, for example.

Furthermore, although the control unit 74 controls the substrate currents to flow until the differences between the threshold voltages Vth of the transistors become within 1 mV in the process illustrated in FIG. 15, the process is not limited thereto. For example, the control unit 74 may control the substrate currents to flow so that charge is stored in the charge storage films 107 until the determining unit 72 determines whether or not the threshold voltage Vth changing with the charge stored in the charge storage film 107 has reached a target value (the difference being within 1 mV) and whether or not the total amount of current flowing through the substrate 101 has reached the upper limit (x that satisfies $y=18.37x^{0.14}$) on the basis of the gate voltages, the drain currents and the substrate currents detected by the detecting unit 70 and, determines that either of the target value or the upper limit is reached.

As described above, since the semiconductor circuit 100 (transistor) of the present embodiment allows external application of voltages so that the source and the drain are reversed during writing and includes a plurality of nodes capable of detecting the gate voltage, the drain current, and the substrate current, it is possible to prevent the characteristics from being changed again after adjustment of the characteristics.

While certain embodiments have been described, these embodiments have been presented by way of example only, and are not intended to limit the scope of the inventions. Indeed, the novel, embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor circuit comprising:
    a substrate made of a semiconductor in which two diffusion layers each serving as either a source or a drain are formed;
    a tunnel oxide film formed on a region of the substrate between the diffusion layers;
    a charge storage film formed on the tunnel oxide layer and configured to store charge;
    a blocking layer formed between the charge storage film and a gate electrode, the blocking layer having layers of a first oxide film, a nitride film and a second oxide film to have a thickness of 5 nm or larger but 15 nm or smaller; and
    a plurality of nodes allowing external application of voltages so that the source and the drain are reversed and allowing detection a gate voltage, a drain current, and a substrate current.

2. The semiconductor circuit according to claim 1, further comprising:
    a detector configured to detect the gate voltage, the drain current and the substrate current via the nodes;
    a determining unit configured to determine whether or not a threshold voltage changing with charge stored in the charge storage film has reached a target value and whether or not a total amount of charge flowing through the substrate has reached an upper limit on a basis of the gate voltage, the drain current and the substrate current detected by the detector; and
    a control unit configured to control the substrate current to flow so that charge is stored in the charge storage film until the determining unit determines that either the target value or the upper limit has been reached.

3. A D/A converter with multi-bit resolution comprising a plurality of the semiconductor circuits according to claim 1.

4. A mixer circuit comprising a plurality of the semiconductor circuits according to claim 1 that constitutes a pair and receives differential signals.

5. A radio communication device comprising at least one of a D/A converter with multi-bit resolution including a plurality of the semiconductor circuits according to claim 1 and a mixer circuit including a plurality of the semiconductor circuits according to claim 1 that constitutes a pair and receives differential signals.

6. A method for adjusting a threshold voltage of a transistor having a charge storage film between a region of a substrate made of a semiconductor between two diffusion layers formed in the substrate and a gate electrode, the method comprising:
    detecting a gate voltage, a drain voltage and a substrate voltage;
    determining whether or not a threshold voltage changing with charge stored in the charge storage film has reached a target value and whether or not a total amount of charge flowing through the substrate has reached an upper limit on a basis of the gate voltage, the drain current and the substrate current that are detected; and
    controlling the substrate current to flow so that charge is stored in the charge storage film until either the target value or the upper limit is determined to be reached.

7. A method for determining a quality of a transistor having a charge storage film between a region of a substrate made of a semiconductor between two diffusion layers formed in the substrate and a gate electrode, the method comprising:
    detecting a gate voltage, a drain voltage and a substrate voltage;
    determining whether or not a threshold voltage changing with charge stored in the charge storage film has reached a target value and whether or not a total amount of charge flowing through the substrate has reached an upper limit on a basis of the gate voltage, the drain current and the substrate current that are detected;
    controlling the substrate current to flow so that charge is stored in the charge storage film until either the target value or the upper limit is determined to be reached; and
    determining as good quality when the target value is reached before the upper limit is reached but determining as bad quality when the upper limit is reached before the target value is reached.

* * * * *